United States Patent
Lai et al.

(10) Patent No.: US 11,315,826 B2
(45) Date of Patent: Apr. 26, 2022

(54) THREE DIMENSIONAL MEMORY DEVICE AND METHOD FOR FABRICATING THE SAME

(71) Applicant: MACRONIX INTERNATIONAL CO., LTD., Hsinchu (TW)

(72) Inventors: Erh-Kun Lai, Taichung (TW); Hsiang-Lan Lung, Kaohsiung (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 49 days.

(21) Appl. No.: 16/782,093

(22) Filed: Feb. 5, 2020

(65) Prior Publication Data
US 2021/0242072 A1   Aug. 5, 2021

(51) Int. Cl.
| H01L 21/76 | (2006.01) |
| H01L 21/764 | (2006.01) |
| H01L 27/11582 | (2017.01) |
| H01L 23/528 | (2006.01) |
| H01L 21/28 | (2006.01) |
| H01L 21/02 | (2006.01) |
| H01L 21/768 | (2006.01) |
| H01L 21/311 | (2006.01) |

(52) U.S. Cl.
CPC ...... *H01L 21/764* (2013.01); *H01L 21/02636* (2013.01); *H01L 21/31111* (2013.01); *H01L 21/76802* (2013.01); *H01L 21/76877* (2013.01); *H01L 23/528* (2013.01); *H01L 27/11582* (2013.01); *H01L 29/40117* (2019.08)

(58) Field of Classification Search
CPC .......... H01L 27/11582; H01L 2924/00; H01L 2924/0002; H01L 27/11556; H01L 2924/00014
See application file for complete search history.

(56) References Cited

U.S. PATENT DOCUMENTS

| 10,141,221 B1 | 11/2018 | Lai et al. |
| 2010/0320528 A1 | 12/2010 | Jeong et al. |
| 2011/0298013 A1 | 12/2011 | Hwang et al. |

(Continued)

OTHER PUBLICATIONS

Fukuzumi, et al.: "Optimal Integration and Characteristics of Vertical Array Devices for Ultra-High Density, Bit-Cost Scalable Flash Memory"; Center for Semiconductor Research & Development, Toshiba Corporation, Semiconductor Company; © 2007 IEEE; pp. 449-452.

(Continued)

*Primary Examiner* — Tony Tran
(74) *Attorney, Agent, or Firm* — McClure, Qualey & Rodack, LLP

(57) ABSTRACT

A three-dimensional memory device includes a substrate, a plurality of horizontal conductive layers, a plurality of vertical memory structures and a vertical conductive post. The conductive layers are located above the substrate, and immediately-adjacent two of the conductive layers are spaced by a first air gap. The memory structures pass through the conductive layers and are connected to the substrate. The conductive post is located between immediately-adjacent two of the memory structures and passes through the conductive layers and is connected to the substrate. The conductive post is spaced from immediately-adjacent edges of the conductive layers by a second air gap.

8 Claims, 13 Drawing Sheets

(56) References Cited

U.S. PATENT DOCUMENTS

| | | |
|---|---|---|
| 2011/0309430 A1 | 12/2011 | Purayath et al. |
| 2013/0062681 A1 | 3/2013 | Fujiki et al. |
| 2013/0148398 A1 | 6/2013 | Baek et al. |
| 2014/0138760 A1 | 5/2014 | Makala et al. |
| 2014/0264525 A1 | 9/2014 | Takahashi et al. |
| 2015/0069494 A1 | 3/2015 | Makala et al. |
| 2016/0086972 A1 | 3/2016 | Zhang et al. |
| 2016/0118122 A1 | 4/2016 | Hwang et al. |
| 2017/0077140 A1 | 3/2017 | Arai |
| 2019/0312052 A1* | 10/2019 | Lee .................. H01L 27/11573 |

OTHER PUBLICATIONS

Jang, et al.: "Vertical Cell Array using TCAT(Terabit Cell Array Transistor) Technology for Ultra High Density NAND Flash Memory"; 2009 Symposium on VLSI Technology Digest of Technical Papers; pp. 192-193.

Park, et al.: "20nm DRAM: A new beginning of another revolution"; IEDM15-676; © 2015 IEEE; p. 26.5.1-26.5.4.

* cited by examiner

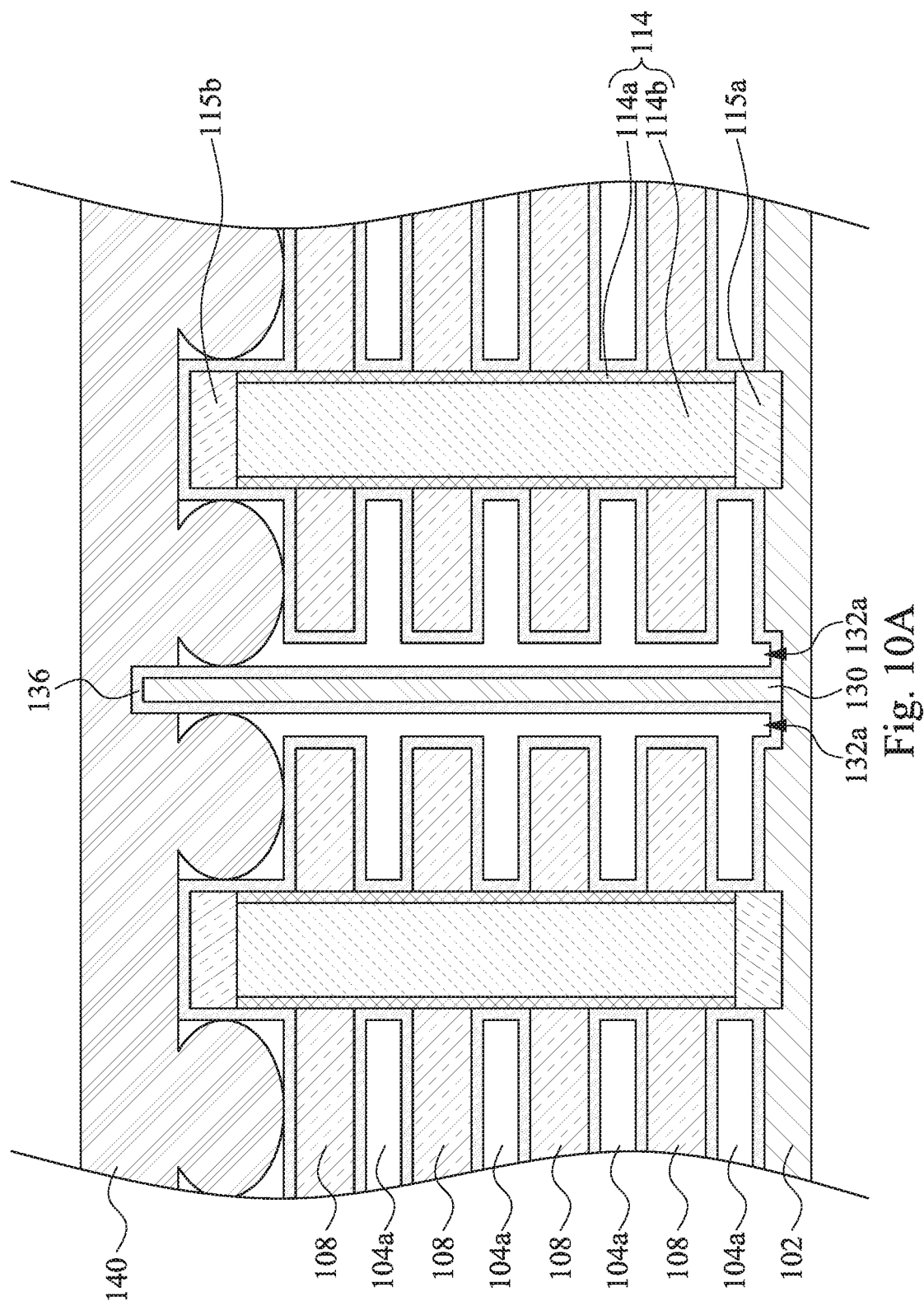

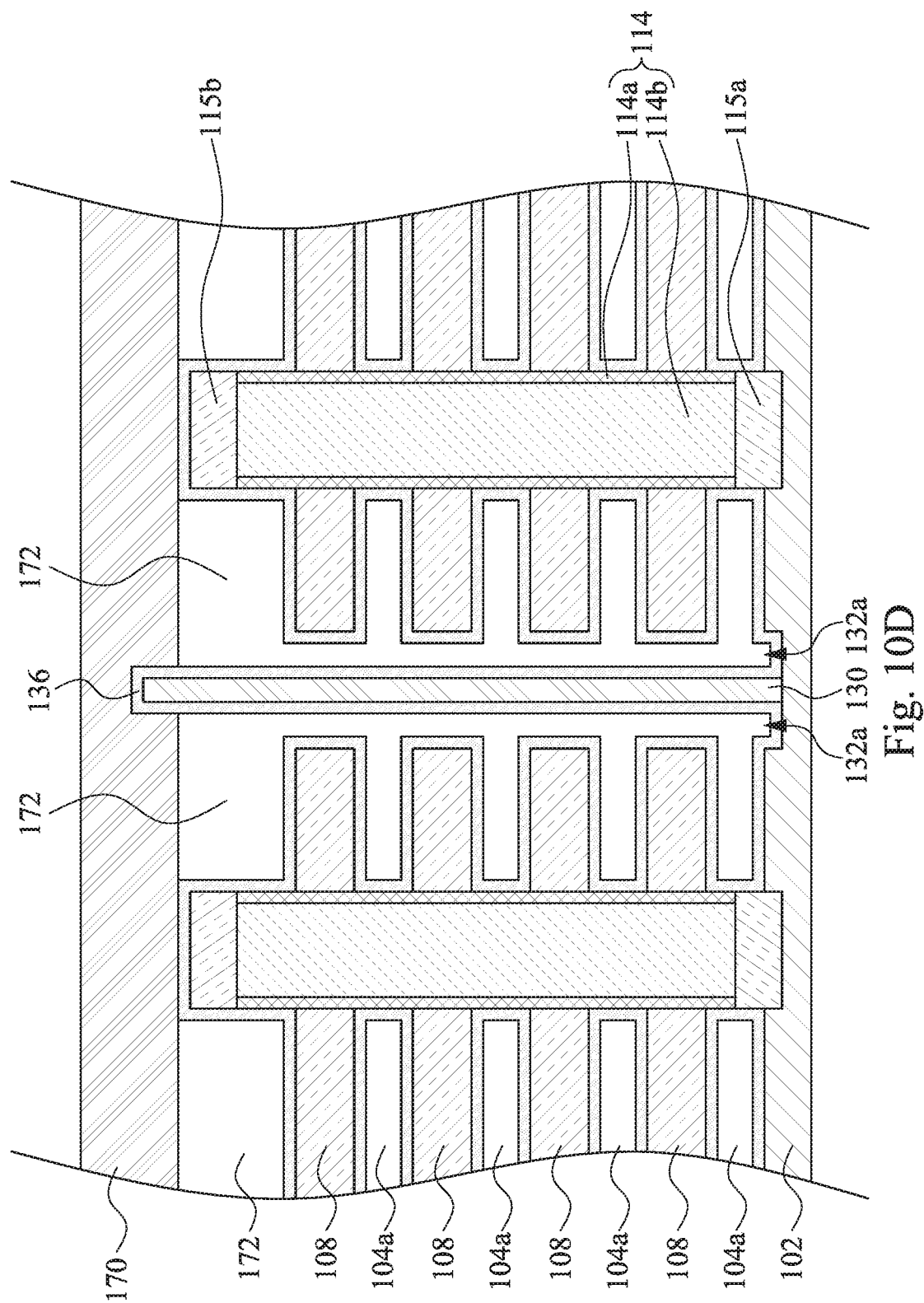

THREE DIMENSIONAL MEMORY DEVICE AND METHOD FOR FABRICATING THE SAME

BACKGROUND

Field of Invention

The present disclosure relates to a memory device and method for fabricating the same, and more particularly to a high-density three dimensional (3D) memory device and method for fabricating the same.

Description of Related Art

Memory devices are important device to a portable electric apparatus, such as a MP3 displayer, a digital camera, a notebook, a cell phone . . . and so on, for data storage. As the increasing applications and functions required by the users, the trend for the memory devices pursues higher storage density and smaller cell size. To satisfy this requirement, designers have been looking for techniques to provide a 3D memory device with stacked multiple planes of memory cells, such as a vertical-channel (VC) NAND flash memory device.

However, as critical dimensions of devices in integrated circuits shrink to the limits of common memory cell technologies, how to achieve greater storage capacity within a smaller memory device by a conventional process equipment with associated compatibility limitations have become a challenge to the persons skilled in the art. For example, how to reduce capacitance and increase breakdown voltage between metal lines in a high-density three dimensional memory device is an important issue. Therefore, there is a need of providing an improved 3D memory device and the method for fabricating the same to obviate the drawbacks encountered from the prior art.

SUMMARY

One aspect of the present disclosure is to provide a three-dimensional memory device including a substrate, a plurality of horizontal conductive layers, a plurality of vertical memory structures and a vertical conductive post. The conductive layers are located above the substrate, and immediately-adjacent two of the conductive layers are spaced by a first air gap. The memory structures pass through the conductive layers and are connected to the substrate. The conductive post is located between immediately-adjacent two of the memory structures and passes through the conductive layers and is connected to the substrate. The conductive post is spaced from immediately-adjacent edges of the conductive layers by a second air gap.

Another aspect of the present disclosure is to provide a method for fabricating a three-dimensional memory device including steps of alternately depositing multiple first insulating layers and second insulating layers over a substrate; etching first holes through the first and second insulating layers; forming vertical memory structures in the first holes; etching a trench between immediately-adjacent two of the memory structures; etching the first insulating layers via the trench to form voids between the second insulating layers; depositing a conductive material into the voids via the trench to form horizontal conductive layers between the second insulating layers; depositing a third insulating layer over a sidewall of the trench; depositing a vertical conductive post into the trench and within the third insulating layer; and removing the second insulating layers and the third insulating layer to form a first air gap between immediately-adjacent two of the conductive layers and a second air gap between the conductive post and immediately-adjacent edges of the conductive layers.

In one or more embodiments, the first air gap fluidly communicates with the second air gap.

In one or more embodiments, a conformal oxide layer is formed over surfaces of the conductive layers, the memory structures and the conductive post that are exposed to the first and second air gaps.

In one or more embodiments, the oxide layer has a uniform thickness ranging from about 1 nm to about 5 nm.

In one or more embodiments, each memory structure comprises a storage layer in contact with the conductive layers and a channel layer in contact with the storage layer.

In one or more embodiments, the first air gap has a width ranging from about 10 nm to about 50 nm.

In one or more embodiments, the first air gap has a width that is smaller than about 20 nm.

In one or more embodiments, the second air gap has a width ranging from about 10 nm to about 100 nm.

In one or more embodiments, the second air gap has a width that is smaller than about 50 nm.

In one or more embodiments, a non-conformal layer is located over top portions of the conductive layers, the memory structures and the conductive post.

In one or more embodiments, the non-conformal layer has a third air gap between the conductive post and an immediately-adjacent one of the memory structures.

In one or more embodiments, the third air gap does not fluidly communicate with the first and second air gaps.

In one or more embodiments, a non-conformal layer is located over top portions of the memory structures and the conductive post, and a third air gap is formed under the non-conformal layer and between the conductive post and an immediately-adjacent one of the memory structures.

In one or more embodiments, the third air gap fluidly communicates with the first and second air gaps.

In sum, a semiconductor memory device is equipped air gaps between immediately-adjacent word lines, and air gaps between a source line and immediately-adjacent word lines such that the capacitance therebetween can be effectively reduced and the breakdown voltage therebetween can be effectively increased. Therefore, the dummy insulating layers could be thinner and thus easier to stack more layers, and the gaps between the source line and immediately-adjacent word lines could be reduced and the cell density will be increased.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
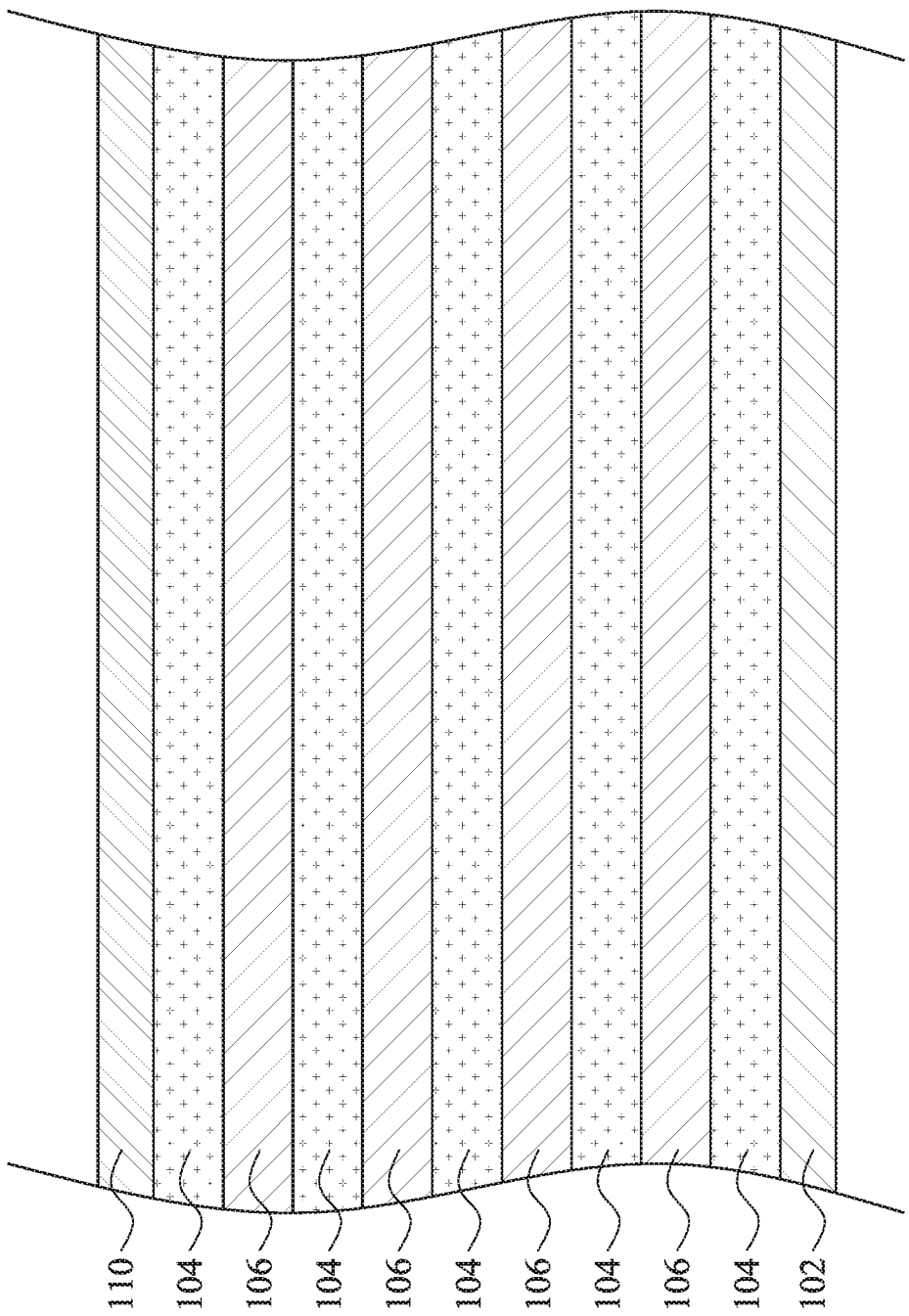
FIGS. 1-10D illustrate cross sectional views of a method for manufacturing a semiconductor memory device at various stages in accordance with some embodiments of the present disclosure.

The embodiments as illustrated below provide a 3D memory device and the method for fabricating the same to achieve greater storage capacity within a smaller memory device without deteriorating its operation performance. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

It should be noted that although "first", "second" or the like may be used herein to describe various elements, components, regions, layers and/or portions, these elements, components, regions, layers and/or portions should not be limited by these terms. These terms are only used to distinguish one element, component, region, layer and/or portion from another element, component, region, layer and/or portion.

The terminology used herein is for the purpose of describing particular embodiments of the invention. For example, using "a", "an" and "the" should not be used to limit singular or plural forms of the elements. The word "or" as used herein may mean "and/or". As used herein, the term "and/or" includes any and all combinations of one or more of the associated listed items. It is also noted that the terms "including" or "having" used in the specification, are intended to include features, regions, steps, operations, elements, and/or components, and not intended to exclude addition of other features, regions, steps, operations, elements, and/or components or combinations thereof.

Reference is made to FIGS. 1-10D, which illustrate cross sectional views of a method for manufacturing a semiconductor memory device at various stages in accordance with some embodiments of the present disclosure.

Referring to FIG. 1, multiple insulating layers 104 and insulating layers 106 are alternately deposited over a semiconductor substrate 102 or an oxide layer above a semiconductor substrate to form a multi-layer stacked structure. In some embodiments of the present disclosure, the insulating layers 104 may be made from dielectric materials including oxide materials such as silicon oxide, and the insulating layers 106 may be made from dielectric materials including nitride materials such as silicon nitride. A hard mask layer 110 is further deposited over the multi-layer stacked structure, and the hard mask layer 110 may be made from dielectric materials different from that of the insulating layers 104. In this embodiment, the hard mask layer 110 may be deposited over a top one of the insulating layers 104.

Figure 2:
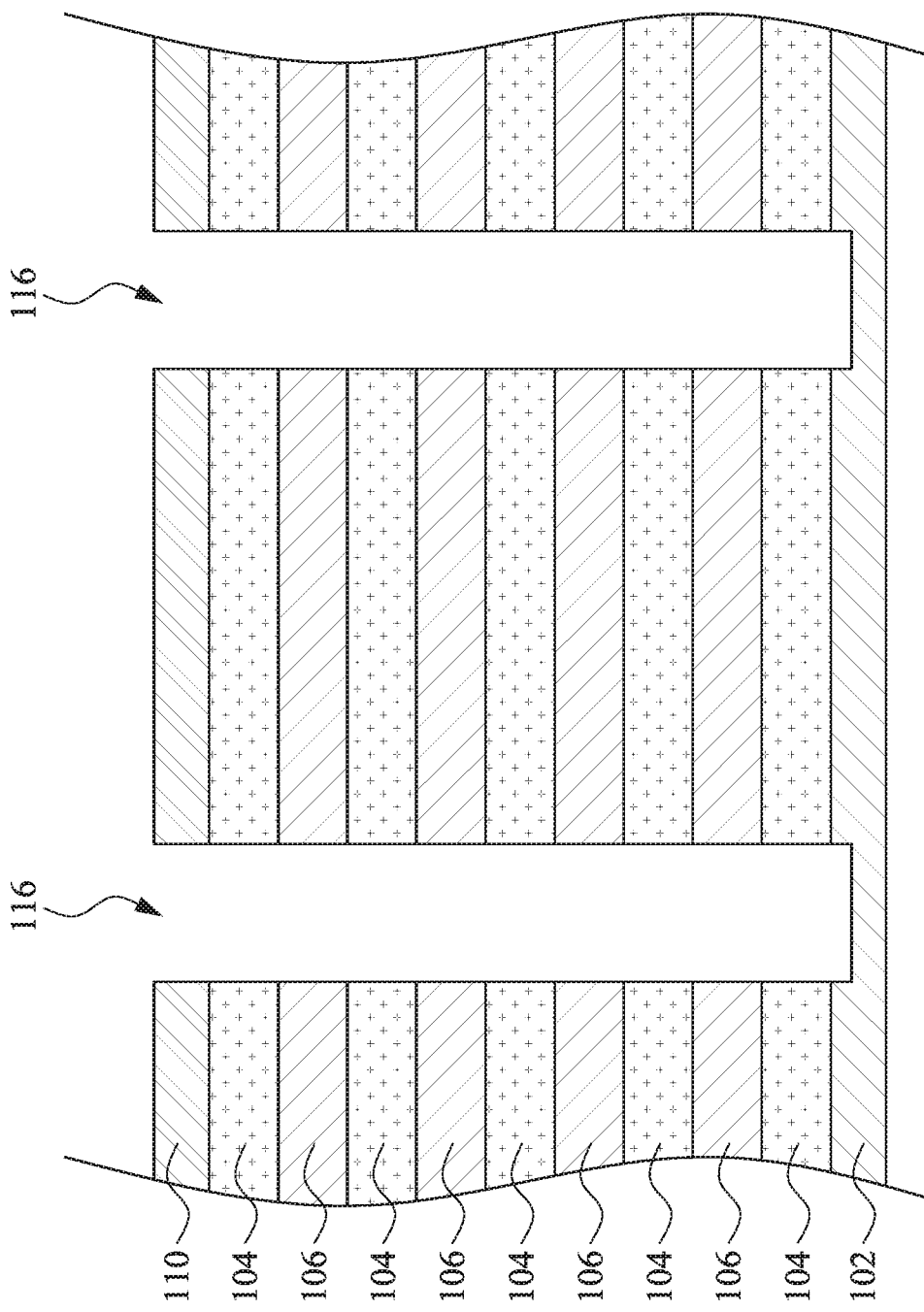

Referring to FIG. 2, an etch step is performed to form multiple holes 116 on the multi-layer stacked structure so as to form an array of holes, i.e., multiple rows of holes. Each hole 116 passes through the multi-layer stacked structure (104, 106) and the hard mask layer 110 to expose the substrate 102. In some embodiments of the present disclosure, the multiple holes 116 may have an O-shaped, oval-shaped, ellipse-shaped or rounded rectangular circumference, but not being limited thereto. In some embodiments of the present disclosure, an anisotropic etching process, such as reactive ion etching (RIE) process is performed using the hard mask layer 110 as an etching mask, to pattern the multiple holes 116 through the multi-layer stacked structure.

Figure 3:
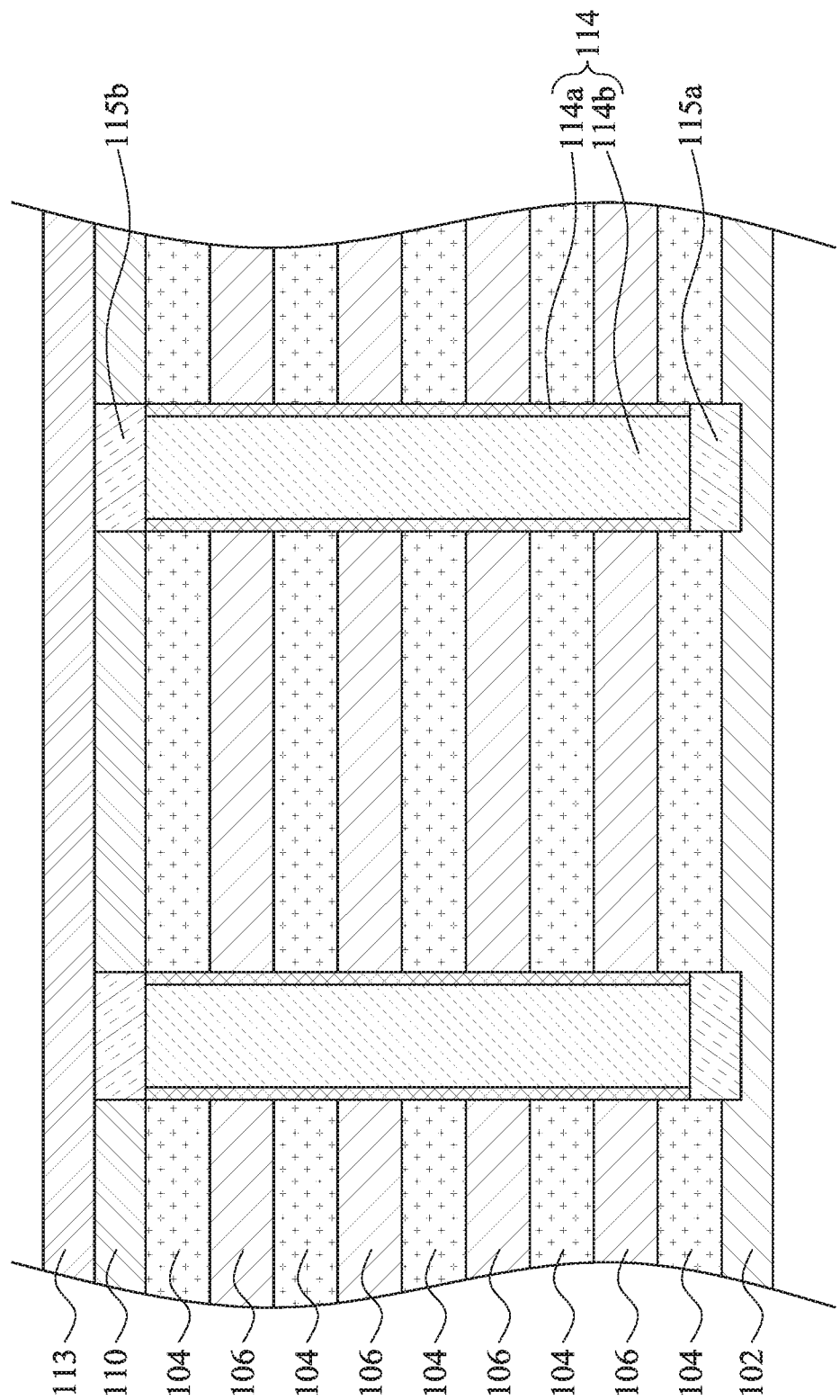

Referring to FIG. 3, a storage layer 114a and a channel layer 114b are then formed over a bottom and a sidewall of each hole 116 by a deposition process to form a vertical memory structure 114. In some embodiments of the present disclosure, the storage layer 114a may be formed of a composite layer including a silicon oxide layer, a silicon nitride layer, and a silicon oxide layer (i.e., an ONO layer stack). However, the structure of the storage layer is not limited to this regard. In some other embodiments, the storage layer may be selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In the present embodiment, the storage layer 114a includes an ONO structure. The channel layer 114b may be made from doped or undoped semiconductor materials, and may be made of poly-silicon in the present embodiment. In some other embodiments, a self-epitaxial-growth (SEG) silicon 115a may be deposited at the bottom of each hole 116, and a landing pad 115b may be deposited at a top of each hole 116. A cap oxide layer 113 may be deposited over the hard mask layer 110 and the holes 116 to protect the memory structure 114.

Figure 4:
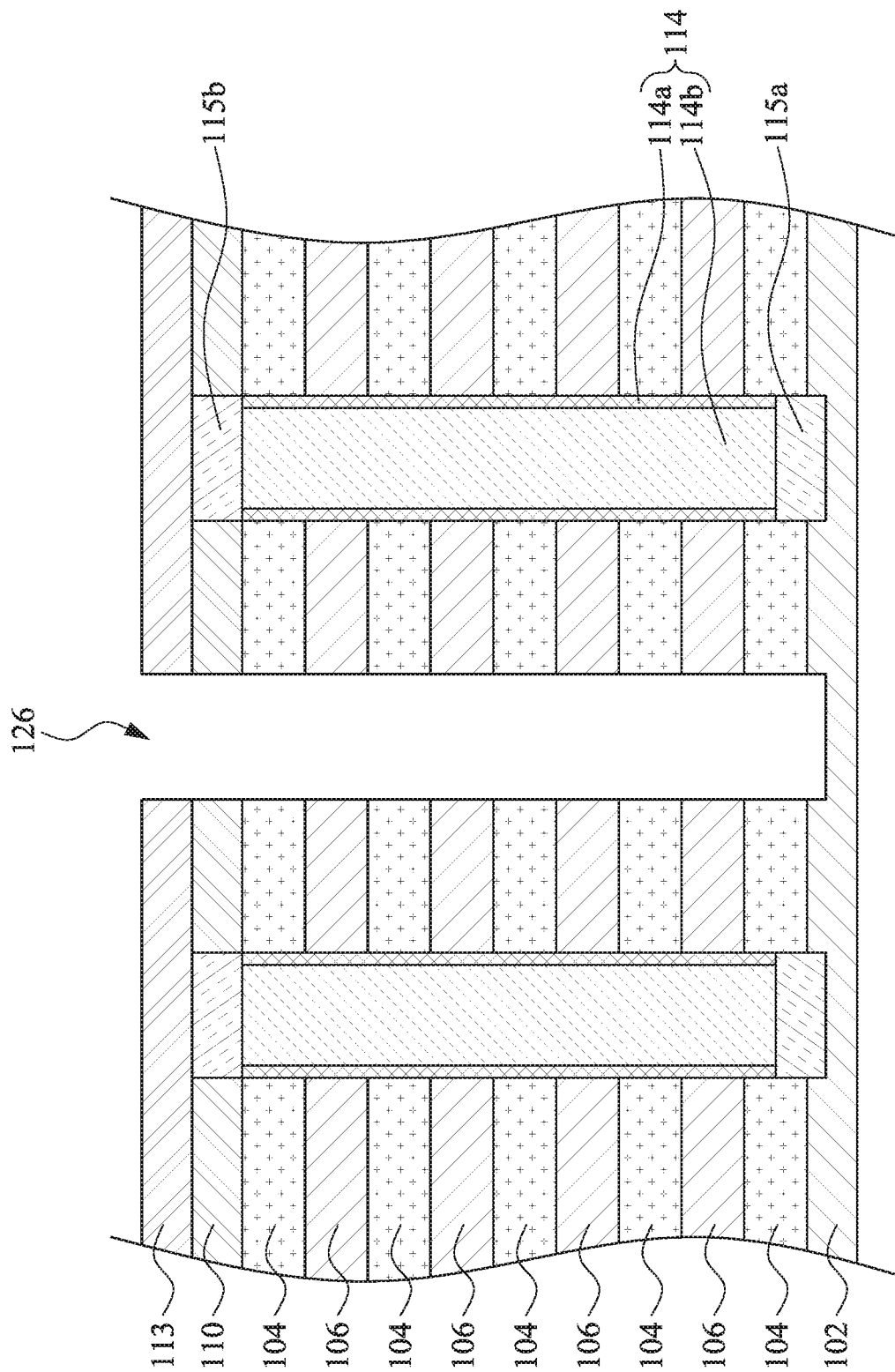

Referring to FIG. 4, an etch step is performed to form a silt trench 126 between immediately-adjacent two of the memory structures 114 to pass through multi-layer stacked structure of the insulating layers 104 and insulating layers 106, thereby exposing the substrate 102.

Figure 5:
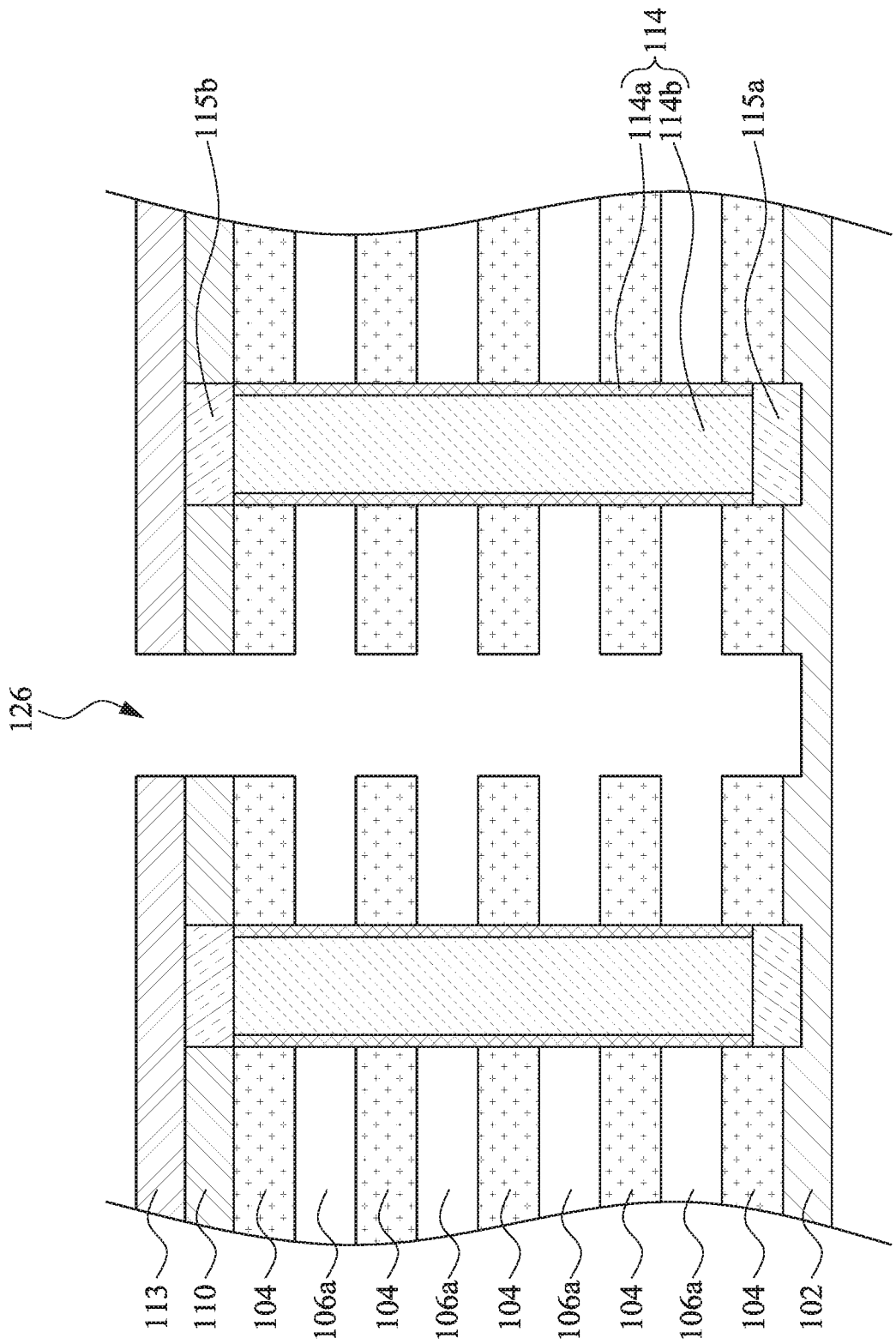

Referring to FIG. 5, a wet etching process is performed to remove the insulating layers 106 of the multi-layer stacked structure until sidewalls of the memory structures 114 are exposed in each trench 126. The wet etching process is performed by filling an etchant that has a much faster etch rate to the insulating layers 106 than to the insulating layers 104 and the storage layers 114a such that all the insulating layers 106 between the insulating layers 104 will be almost removed so as to form voids 106a between the remaining (not being etched) insulating layers 104. Therefore, sidewalls, i.e., sidewalls of the storage layers 114a, of the memory structures 114 are exposed in each trench 126. The memory structures 114 serve as support pillars to retain the remaining insulating layers 104 such that the insulating layers 104 would not collapse due to the voids 106a therebetween.

Figure 6:
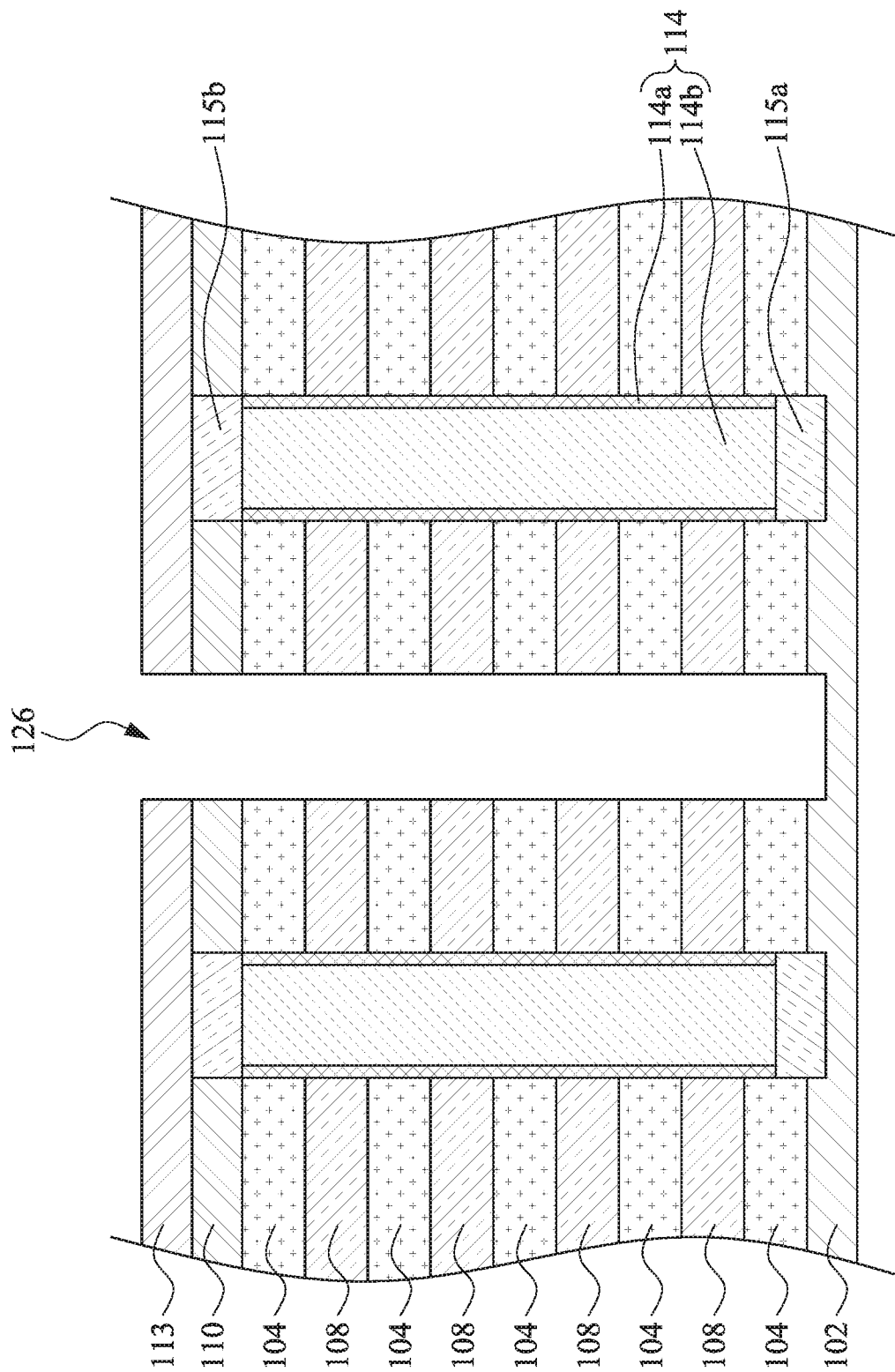

Referring to FIG. 6, a conductive material is deposited into each trench 126 to form conductive layers 108 to fill into the voids. Each conductive layer 108 should reach or contact exposed sidewalls of the memory structures 114. The conductive material may include metals, such as Cu, Al, W or the metal alloys thereof. An etching process may be performed to remove excess conductive materials in the holes 126 to space adjacent conductive layers 108 from one another to prevent from bridging between adjacent conductive layers 108. The conductive layers 108 may serve as "word lines" in a three dimensional (3D) memory device.

Figure 7:
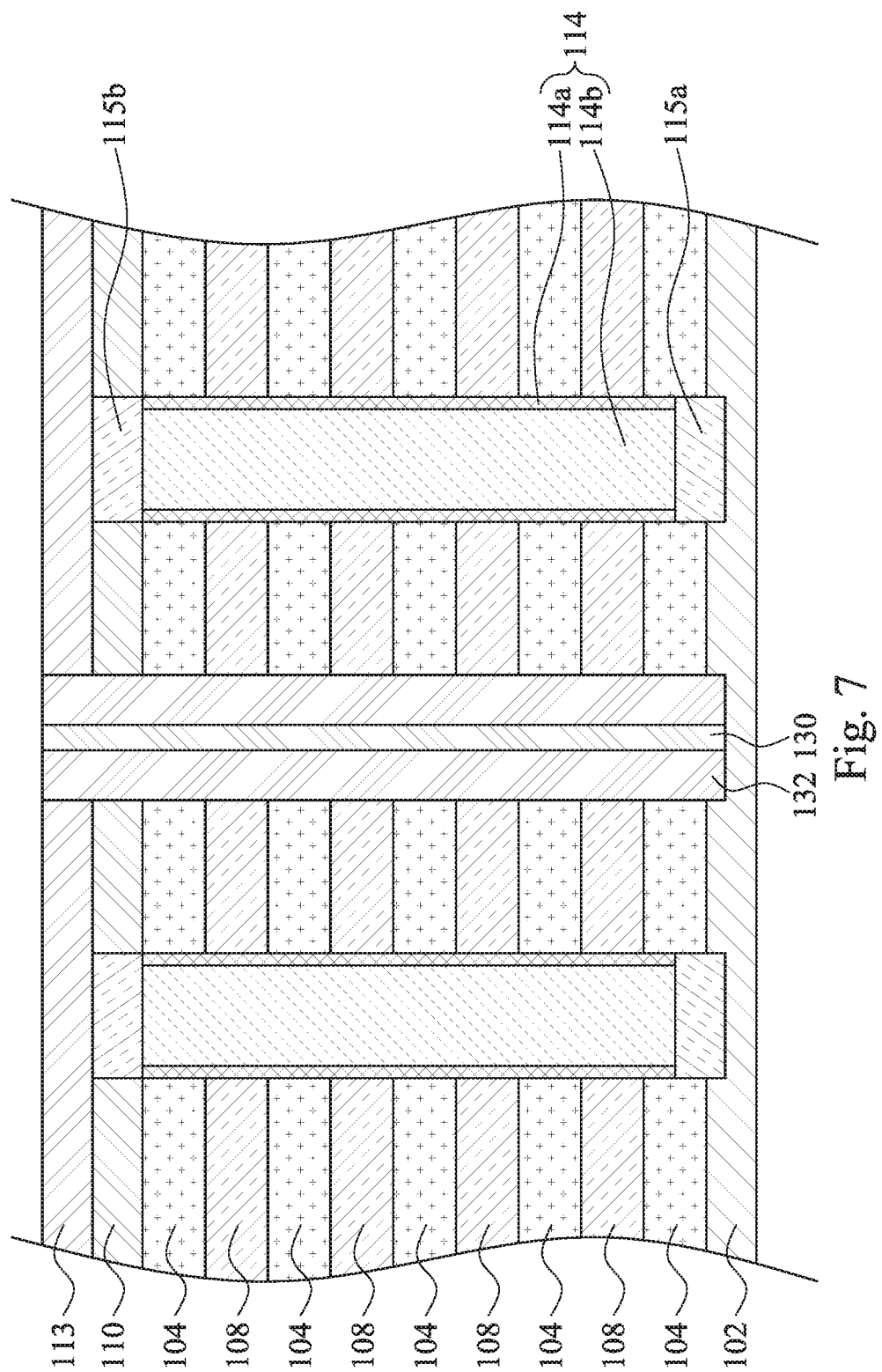

Referring to FIG. 7, an oxide insulating layer 132 may be deposited over a sidewall of each trench 126, and a vertical conductive wall or post 130 may be deposited within and in contact with the oxide insulating layer 132. Therefore, the conductive post 130 is spaced from the edges of the conductive layers 108 and the insulating layers 104 by the oxide insulating layer 132. The vertical conductive post 130 may include metals, such as Cu, Al, W or the metal alloys thereof and may serve as "source line" in a three dimensional (3D) memory device.

Figure 8:
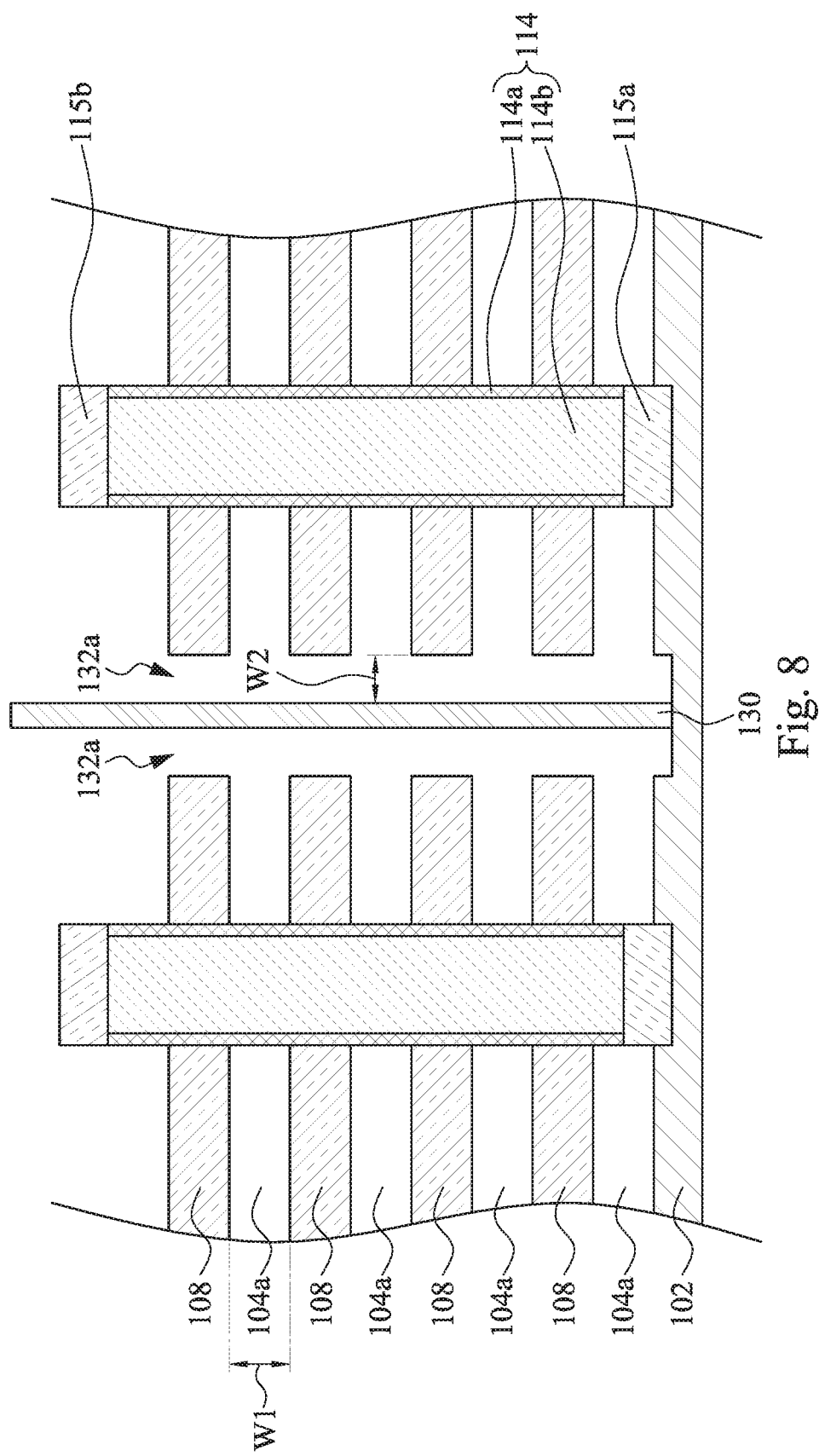

Referring to FIG. 8, another wet etching process is performed to remove all oxide-based layers (including the insulating layers 104, the oxide insulating layer 132, the hard mask layer 110 and the cap oxide layer 113). The wet etching process is performed by filling an etchant that has a much faster etch rate to the oxide-based materials than to the conductive layers 108, the conductive post 130 and the storage layers 114a such that all oxide-based layers will be almost removed so as to form voids among the remaining (not being etched) conductive layers 108 and the conductive post 130. The memory structures 114 still serve as support pillars to retain the remaining conductive layers 108 such that the conductive layers 108 would not collapse due to the voids therebetween.

In some embodiments of the present disclosure, an air gap 104a is formed between immediately-adjacent two of the conductive layers 108 and has a width (W1) ranging from about 10 nm to about 50 nm. In some embodiments of the present disclosure, the air gap 104a may have a width (W1) that is smaller than about 20 nm. In some embodiments of the present disclosure, an air gap 132a is formed between the conductive post 130 and immediately-adjacent edges of the conductive layers 108 and has a width (W2) ranging from about 10 nm to about 100 nm. In some embodiments of the present disclosure, the air gap 132a may have a width (W2) that is smaller than about 50 nm. In some embodiments of the present disclosure, the air gaps 104a fluidly communicate with the air gaps 132a.

Figure 9:
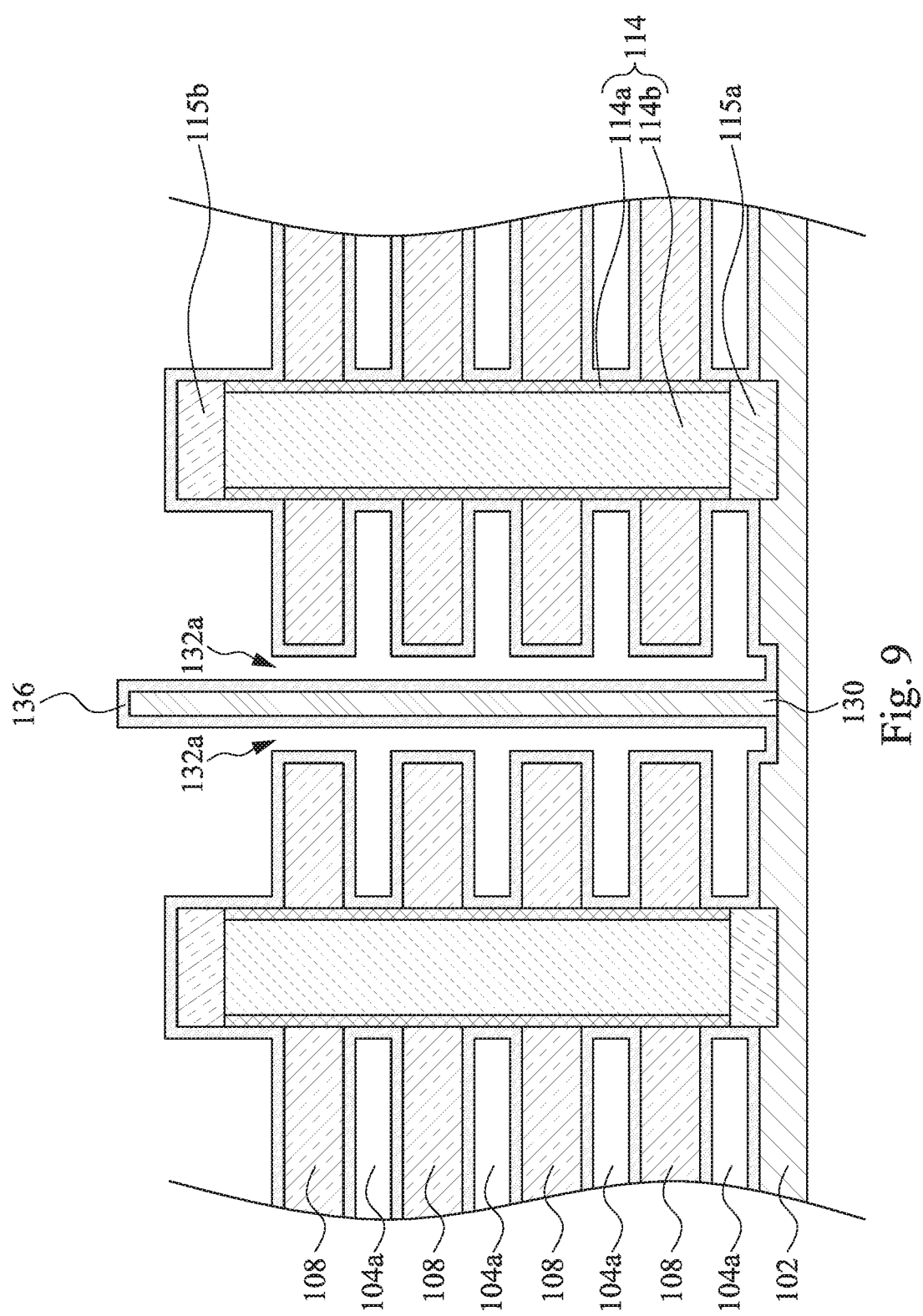

Referring to FIG. 9, a conformal oxide layer 136 may be formed over all surfaces of the conductive layers 108, the memory structures 114 and the conductive post 130 that are exposed to the air gaps (104a, 132a), but not being limited thereto. In some embodiments of the present disclosure, the oxide layer 136 may have a uniform thickness ranging from about 1 nm to about 5 nm. The conformal oxide layer 136 is configured to retain the conductive layers 108 to the memory structures 114 firmly such that the conductive layers 108 would less likely collapse due to the voids or air gaps therebetween. Therefore, the air gaps (104a, 132a) are formed among or between the oxide layers 136, namely, the oxide layers 136 wrap around the air gaps (104a, 132a).

Referring to FIG. 10A, a non-conformal layer 140 is deposited over top portions of the conductive layers 108, the memory structures 114 and the conductive post 130 and not filled into air gaps (104a, 132a).

Figure 10B:
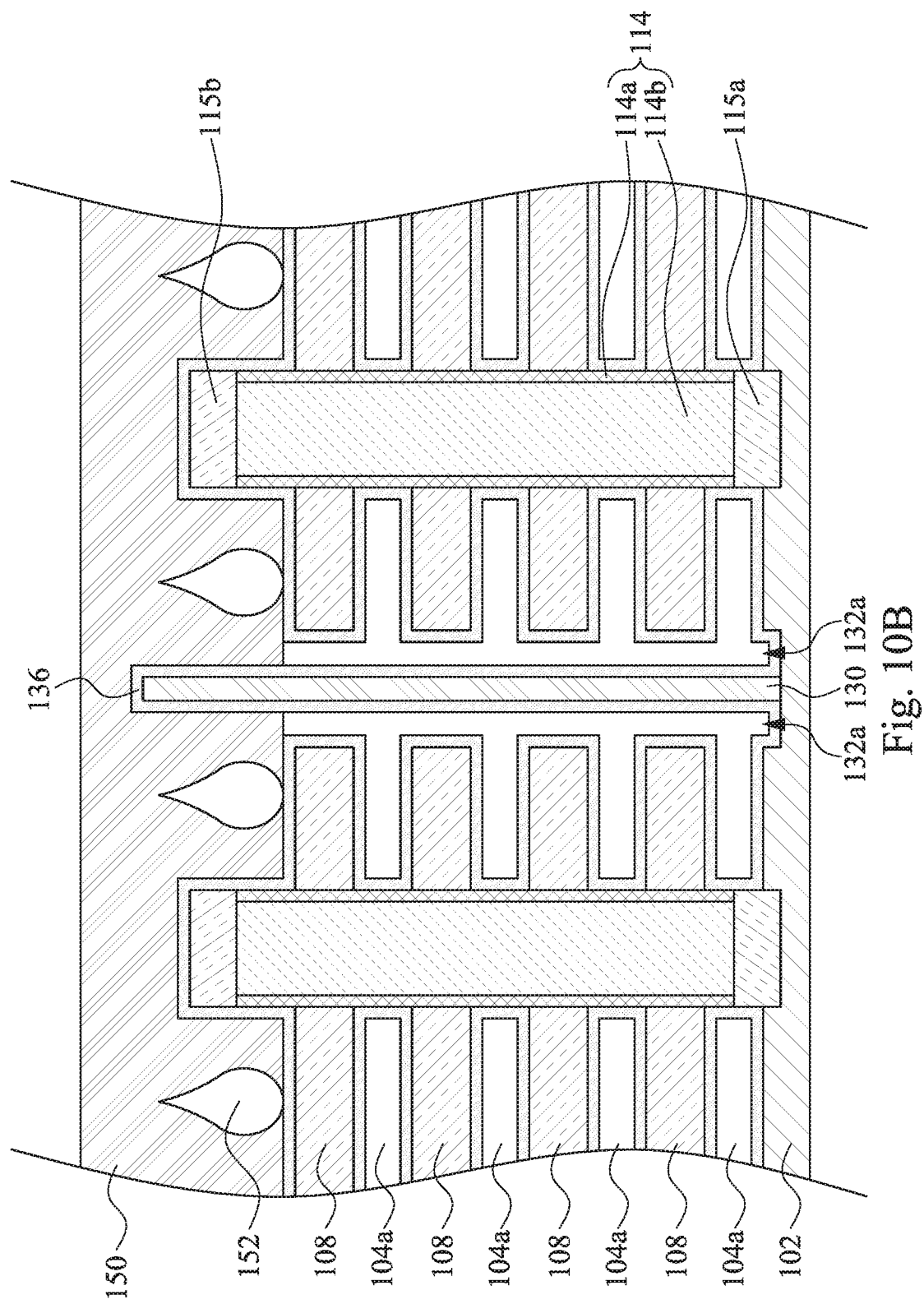

Referring to FIG. 10B, a non-conformal layer 150 is deposited over top portions of the conductive layers 108, the memory structures 114 and the conductive post 130 and not filled into air gaps (104a, 132a). An air gap 152 is formed within the non-conformal layer 150 and between the conductive post 130 and an immediately-adjacent one of the memory structures 114. The air gaps 152 do not fluidly communicate with the air gaps (104a, 132a).

Figure 10C:
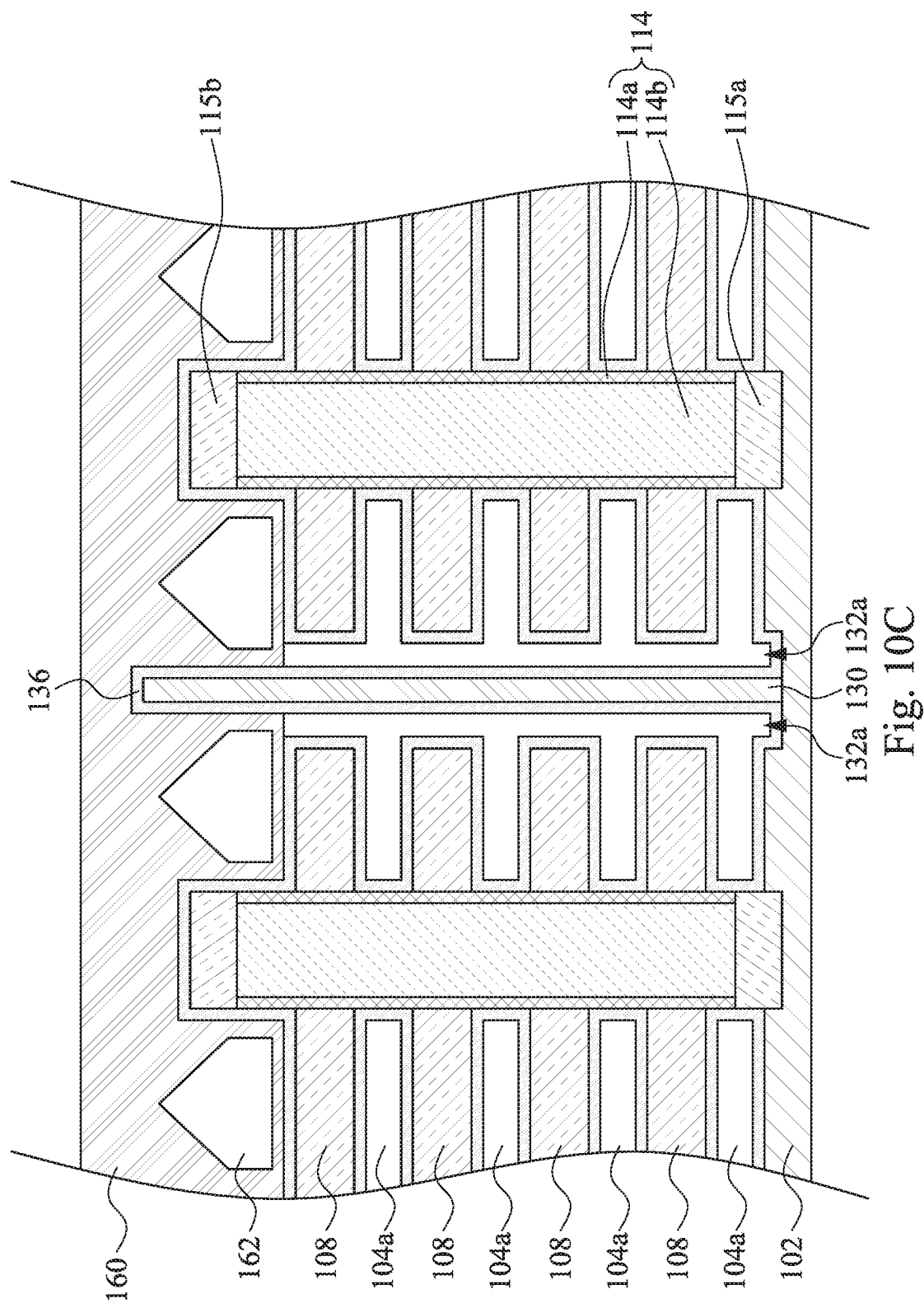

Referring to FIG. 10C, a non-conformal layer 160 is deposited over top portions of the conductive layers 108, the memory structures 114 and the conductive post 130 and not filled into air gaps (104a, 132a). An air gap 162 is formed within the non-conformal layer 160 and between the conductive post 130 and an immediately-adjacent one of the memory structures 114. The air gap 162 has a different shape from that of the air gap 152. The air gaps 162 do not fluidly communicate with the air gaps (104a, 132a).

Referring to FIG. 10D, a non-conformal layer 170 is deposited over top portions of the memory structures 114 and the conductive post 130 and not filled into air gaps (104a, 132a). Therefore, an air gap 172 is formed under the non-conformal layer 170 and between the conductive post 130 and an immediately-adjacent one of the memory structures 114. The air gap 172 fluidly communicates with the air gaps (104a, 132a).

In some embodiments of the present disclosure, the non-conformal layers (140, 150, 160, 170) are made from dielectric materials, e.g., oxide or nitride materials.

According to aforementioned embodiments, a semiconductor memory device is equipped air gaps between immediately-adjacent word lines, i.e., the conductive layers 108, and air gaps between a source line, i.e., the conductive post 130 and immediately-adjacent word lines such that the capacitance therebetween can be effectively reduced and the breakdown voltage therebetween can be effectively increased. Therefore, the dummy insulating layers, i.e., the insulating layers 104 and 106, could be thinner and thus easier to stack more layers, and the gaps between the source line and immediately-adjacent word lines could be reduced and the cell density will be increased.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A three-dimensional (3D) memory device, comprising:
   a substrate;
   a plurality of horizontal conductive layers disposed above the substrate, immediately-adjacent two of the conductive layers are spaced by a first air gap;
   a plurality of vertical memory structures passing through the conductive layers and connected to the substrate;
   a vertical conductive post disposed between immediately-adjacent two of the memory structures and passing through the conductive layers and connected to the substrate, the conductive post is spaced from immediately-adjacent edges of the conductive layers by a second air gap at a horizontal level, wherein the second air gap fills up an entire area between the vertical conductive post and a corresponding one of the vertical memory structures;
   a conformal oxide layer having a first portion formed between the first air gap and the vertical memory structures, and a second portion formed between the first air gap and the conductive layers, wherein the first portion and the second portion have a uniform thickness; and
   a non-conformal layer disposed over top portions of the conductive layers, the memory structures and the conductive post, wherein the non-conformal layer has a third air gap disposed between the conductive post and an immediately-adjacent one of the memory structures, the third air gap does not fluidly communicate with the first and second air gaps.

2. The 3D memory device of claim 1, wherein the first air gap fluidly communicates with the second air gap.

3. The 3D memory device of claim 1, wherein the uniform thickness ranges from about 1 nm to about 5 nm.

4. The 3D memory device of claim 1, wherein each memory structure comprises a storage layer in contact with the conductive layers and a channel layer in contact with the storage layer.

5. The 3D memory device of claim 1, wherein the first air gap has a width ranging from about 10 nm to about 50 nm.

6. The 3D memory device of claim 1, wherein the first air gap has a width that is smaller than about 20 nm.

7. The 3D memory device of claim 1, wherein the second air gap has a width ranging from about 10 nm to about 100 nm.

8. The 3D memory device of claim 1, wherein the second air gap has a width that is smaller than about 50 nm.

* * * * *